United States Patent [19]

Watanabe et al.

[11] Patent Number: 4,942,536
[45] Date of Patent: Jul. 17, 1990

[54] METHOD OF AUTOMATIC CIRCUIT TRANSLATION

[75] Inventors: Toshinori Watanabe, Sagamihara; Fumihiko Mori, Yokohama; Tamotsu Nishiyama, Inagi; Makoto Furihata, Sawa; Yasuo Kominami; Noboru Horie, both of Takasaki, all of Japan

[73] Assignees: Hitachi, Ltd.; Hitachi Microcomputer Engineering Ltd., both of Tokyo, Japan

[21] Appl. No.: 854,032

[22] Filed: Apr. 21, 1986

[30] Foreign Application Priority Data

Apr. 19, 1985 [JP] Japan .................................. 60-82400

[51] Int. Cl.$^5$ .............................................. G06F 15/60
[52] U.S. Cl. .................................... 364/490; 364/489; 364/488
[58] Field of Search ............... 364/488, 489, 490, 491, 364/300

[56] References Cited

U.S. PATENT DOCUMENTS

| | | | |
|---|---|---|---|
| 4,564,773 | 1/1986 | Tanizawa et al. | 364/491 |
| 4,583,169 | 4/1986 | Cooledge | 364/300 |
| 4,591,993 | 5/1986 | Griffin et al. | 364/491 |
| 4,636,966 | 1/1987 | Yamada et al. | 364/300 |
| 4,703,435 | 10/1987 | Darringer et al. | 364/489 |

OTHER PUBLICATIONS

"Automated Technology Mapping" by J. L. Gilkinson et al., IBM J. Res. Develop., vol. 28, No. 5, Sep. 1984, pp. 546–555.
"Logic Synthesis Through Local Transformations" by J. A. Darringer et al., IBM J. Res. Develop., vol. 25, No. 4, Jul. 1981, pp. 272–280.
"LORES-Logic Reorganization System" by Nakamura et al., IEEE 15th Design Automation Conference, 1978.
"Translation of a DDL Digital System Specification to Boolean Equations" by Duley et al., IEEE Trans. on Computers, vol. C-18, No. 4, Apr. 1969, pp. 305–313.
"A New Look at Logic Synthesis" by Darringer et al., 17th DA Conference 1980, pp. 543.
"Method Used in an Automatic Logic Design Generator (ALERT)" by Friedman et al., IEEE Trans. on Computers, vol. C-18, No. 7, Jul. 1969, p. 593.
"Quality of Designs from an Automatic Logic Generator (ALERT)" by Friedman et al., 7th DA Conference 1970, p. 71.
"Synthesis of Combination Logic Networks", D. L. Dietmeyer, Allynt Bacon, Boston, 1978.
"Logic Synthesis" by Melvin A. Breuer, Prentice-Hall, 1972, pp. 21.

Primary Examiner—Parshotam S. Lall
Assistant Examiner—V. N. Trans
Attorney, Agent, or Firm—Antonelli, Terry, Stout & Kraus

[57] ABSTRACT

In a case where an electronic circuit having the same function is to be realized by a different device, it is indispensable to prepare circuit diagrams conforming to devices and to utilize them for the job of circuit simulation or chip layout. When the circuit diagrams are to be automatically translated for the above purpose, translation rules become different depending upon the connective relations of an element to be translated, with other elements in the circuit or upon a function performed by the element. The present invention puts the rules into knowledge from the viewpoint of knowledge engineering and utilizes it thereby to realize the intended purpose. It is characterized in that, when a circuit constructed of a first type of elements is to be translated into a circuit constructed of second type of elements different from the first type of elements, appropriate ones among translation rules are automatically selected for the respective first or second type of elements on the basis of determined results based on knowledge groups of connective relations with other elements of the same circuit and are applied to the first or second type of elements.

17 Claims, 6 Drawing Sheets

METHOD OF AUTOMATIC CIRCUIT TRANSLATION

BACKGROUND OF THE INVENTION

1. Field of the Invention

The present invention relates to a VLSI design automation system, and more particularly to an automatic circuit translation method which automatically translates a circuit element representation required when a circuit having the same function is to be realized by a different device.

2. Description of the Prior Art

There has hitherto been known an automatic circuit translation method which is intended for the automatic generation of logic circuits and which automatically generates logic gates from the boolean representation of a circuit function and which makes it automatic to realize a given individual boolean equation logic gates in the smallest possible number.

In contrast, the circuit translation intended by the present invention consists in that the element of a circuit to be translated is automatically translated by utilizing translation rules which vary depending upon the multifarious connective relations of a particular element with the peripheral elements thereof.

SUMMARY OF THE INVENTION

An object of the present invention is to provide a method of automatic circuit translation required when an electronic circuit having the same function is to be realized by a different device.

By way of example, in developing an analog/digital compound VLSI, a circuit represented by ordinary logic gates such as AND and OR gates needs to be automatically translated into an i$^2$L gate. The present invention permits the automation of such processing. To this end, the present invention includes memory means to store translation rules of circuit element representations which are determined depending upon connective relations of each element constituting a circuit with other elements constituting the circuit and also upon a function of the element performed within the circuit, so that when a circuit constructed of a first type of elements is to be translated into a circuit constructed of a second type of element different from said first type of elements, appropriate ones of said translation rules stored in said memory means are automatically selected for the respective first or second type of elements on the basis of results based on knowledge groups of said connective relations with said other elements of the same circuit and are applied to said first or second type of elements.

DETAILED DESCRIPTION OF THE PREFERRED EMBODIMENT

Now, one embodiment of the present invention will be described with reference to FIGS. 1 et seq.

Figure 1:
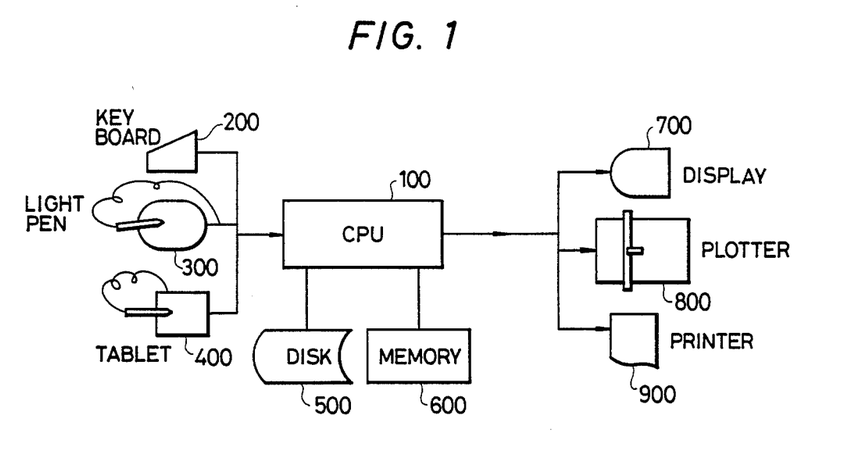
FIG. 1 is a diagram showing a computer environment in which the present invention is performed.

FIG. 1 is a diagram showing a hardware environment for the present invention. The circuit connection information of a circuit to be translated is input by, e.g., a keyboard 200, a light pen 300 and a tablet 400. Circuit translation rules and translation processing programs are held by, e.g., a magnetic disk 500 and a memory 600. The intermediate results and final results of circuit translation are output by, e.g., a display device 700, a plotter 800 and a printer 900.

Figure 2:
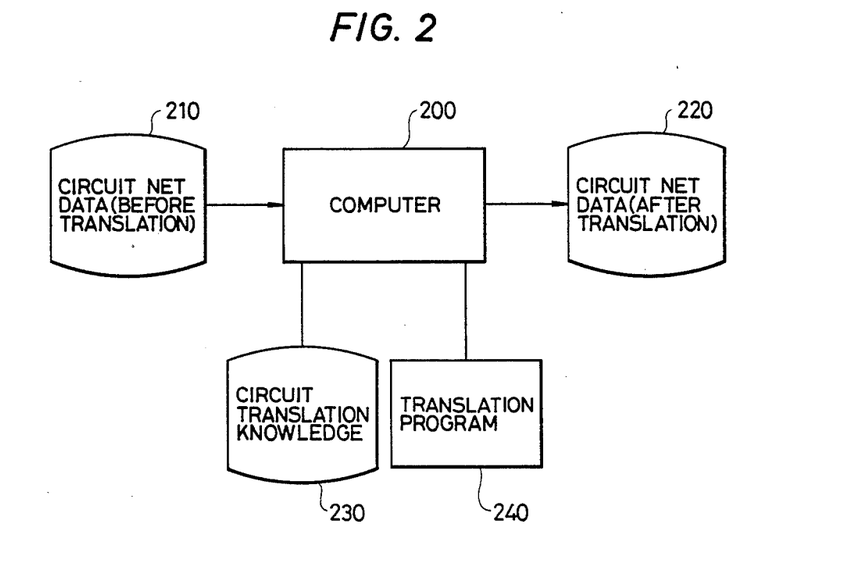
FIG. 2 is a block diagram showing the software arrangement of the present invention.

FIG. 2 shows the software arrangement of the present invention, in which numeral 200 designates a computer. Inputs to the circuit translation system of the present embodiment are circuit net data 210, while results become circuit net data 220. Circuit translation knowledge groups 230 are employed for the translation. A translation run program 240 performs the translation by the use of the knowledge groups 230.

Figure 3:
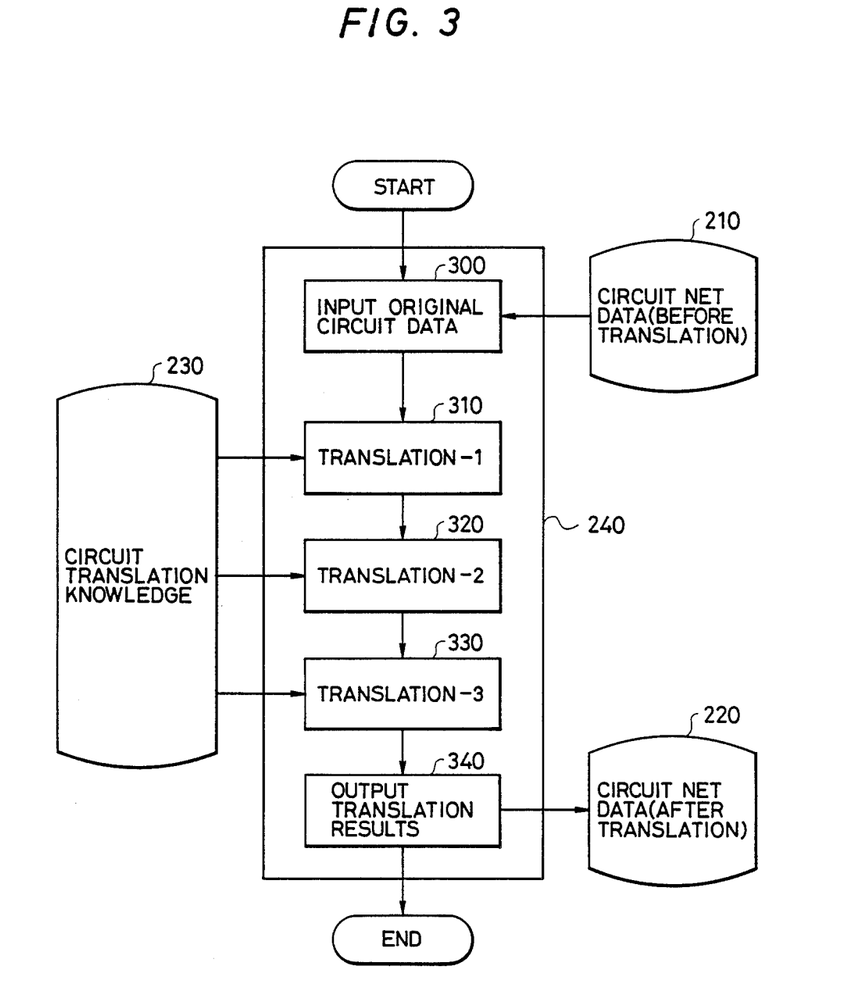
FIG. 3 is a flow diagram showing the processes of the present invention.

FIG. 3 shows processing steps in the system of the present embodiment.

At the first step, original circuit data is loaded into an internal memory (300). At the next step, a primary translation (310) is executed in which the connective relations of the element of a circuit, before translation with the other elements, are analyzed and extracted and are added to the original data. In the next translation (320), the circuit element after the primary translation is transformed into target circuit elements. In the next translation (330), surplus circuit elements involved in circuit data after the secondary translation are reduced. Lastly, results are output (340).

Although the primary translation and the secondary translation can also be collectively executed by one step, the embodiment which executes the separate processing steps will be explained for clarifying the processing.

Figure 4:
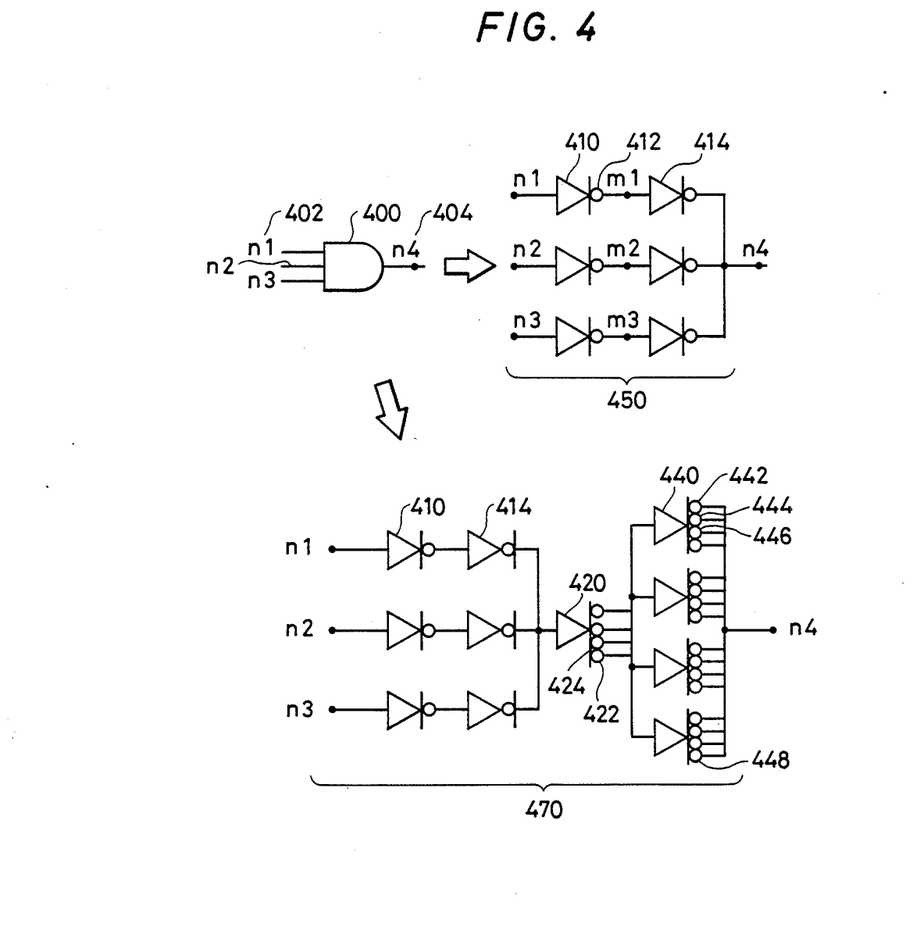
FIG. 4 is a logic diagram showing the translation rule of an AND gate to be handled by the present invention.

FIG. 4 shows an actual example of circuit translation rules. The present embodiment handles the example in which an ordinary logic gate is translated into an i$^2$L gate. Numeral 400 designates an ordinary AND logic gate, which has three inputs $n_1$, $n_2$ and $n_3$ (at 402) and one output $n_4$ (at 404).

A rule for translating this circuit into i$^2$L varies by reflecting the situation of how the AND gate indicated at 400 is related to the other elements in the circuit. In case of this example, the circuit is translated as indicated at numeral 450 when the number of the other elements which are supplied with currents from the point 404 in the figure is at most four. Numerals 410, 414 etc. indicate injectors which operate as current supplying elements. Hereinbelow, they shall be called 'inverters'. Numeral 412 is a symbol expressive of the collector area of the output portion of the inverter, and the number of circles increases in proportion to current. Up to four collectors are allowed. Currents supplied from points $n_1$, $n_2$ and $n_3$ pass through two stages of inverters respectively, and are thereafter totaled at a point $n_4$. As a result, the AND logic is realized.

When the number of the other elements which are supplied with currents from the point 404 in the figure is at least five (allowed up to sixteen), the circuit is transformed as shown at numeral 470, and current at a point $n_4$ is increased. On this occasion, it is necessary to intermediately dispose an inverter of 4 collectors (at numerals 422, 424, etc.) as indicated by numeral 420 and to posteriorly dispose a parallel stage of inverters indicated by numeral 440, etc. so that the total number of collectors at numerals 442, 444, 446, 448, etc. may agree with the number of elements to be supplied with currents from the point $n_4$. In addition, the number of the collectors 422, 424 etc. of the inverter 420 is equal to the number of the parallel inverters 440 etc.

Figure 5:
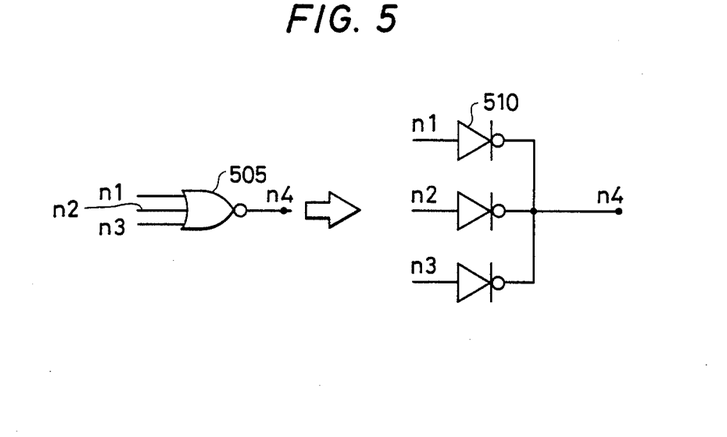
FIG. 5 is a logic diagram showing the translation rule of a NOR gate to be handled by the present invention.

FIG. 5 shows the i²L translation rule of an ordinary NOR logic gate, and it corresponds to a case where the number of elements to be supplied with currents from a point $n_4$ is at most four. In this case, the number of series connections of inverters may be one as indicated by numeral 510. When the number of connections of inverters is at least five, a translation rule similar to that shown in FIG. 4 (470) is employed. While similar translation rules exist for gates other than those shown in FIGS. 4 and 5, they shall be omitted from the present embodiment.

Figure 6:
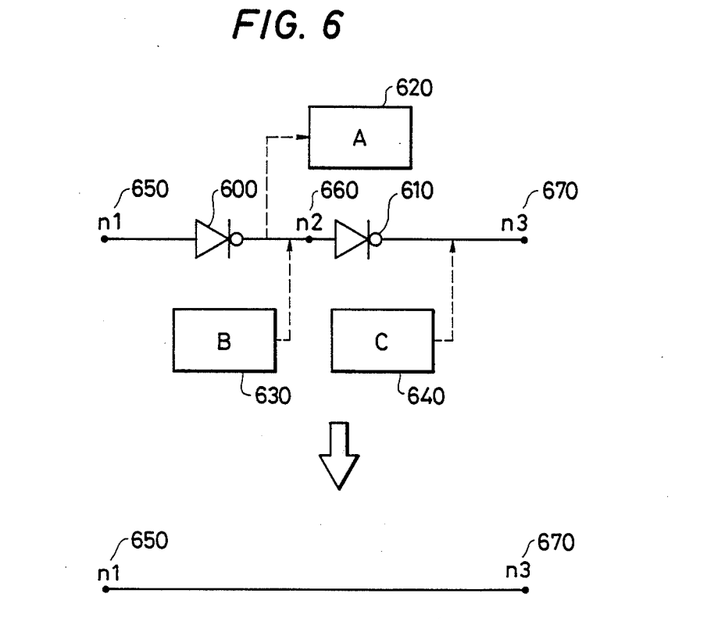
FIG. 6 is an explanatory diagram showing the reduction rule of an i$^2$L circuit to be handled by the present invention.

FIG. 6 exemplifies a rule which reduces surplus elements parts in a circuit after translation. In the presence of two series inverters 600 and 610, in a case where an element A (620) to share an input with an intermediate point $n_2$ does not exist, where an element B (630) to share an output therewith and where an element C (640) to share an output with a point $n_3$ (670) does not exist, the two inverters may well be removed to short a point $n_1$ (650) and the point $n_3$ (670). in an actual circuit, it is sometimes the case that two inverters are intentionally added in order to adjust a signal propagation time. The inverters cannot be removed in the case of this purpose. However, this can be readily coped with by adding to the circuit data beforehand indicating that the purpose of the inverters is the time adjustment, and utilizing this information at the determination of the propriety of the removal, and hence, further description shall be omitted from the present embodiment.

Figure 7:
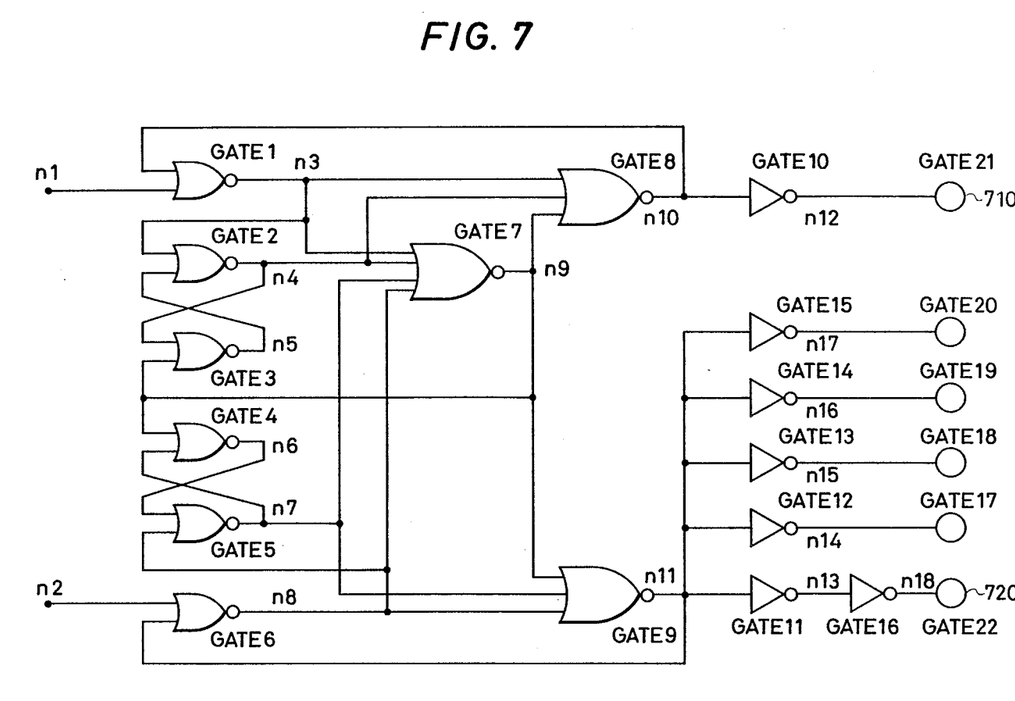
FIG. 7 is a CMOS circuit diagram of a concrete example in the present invention.

FIG. 7 shows a logic circuit which is referred to in the present embodiment and which is realized by NOR and inverter circuits (gate 21 (710)-gate 22 (720) being output terminals).

Figure 8:
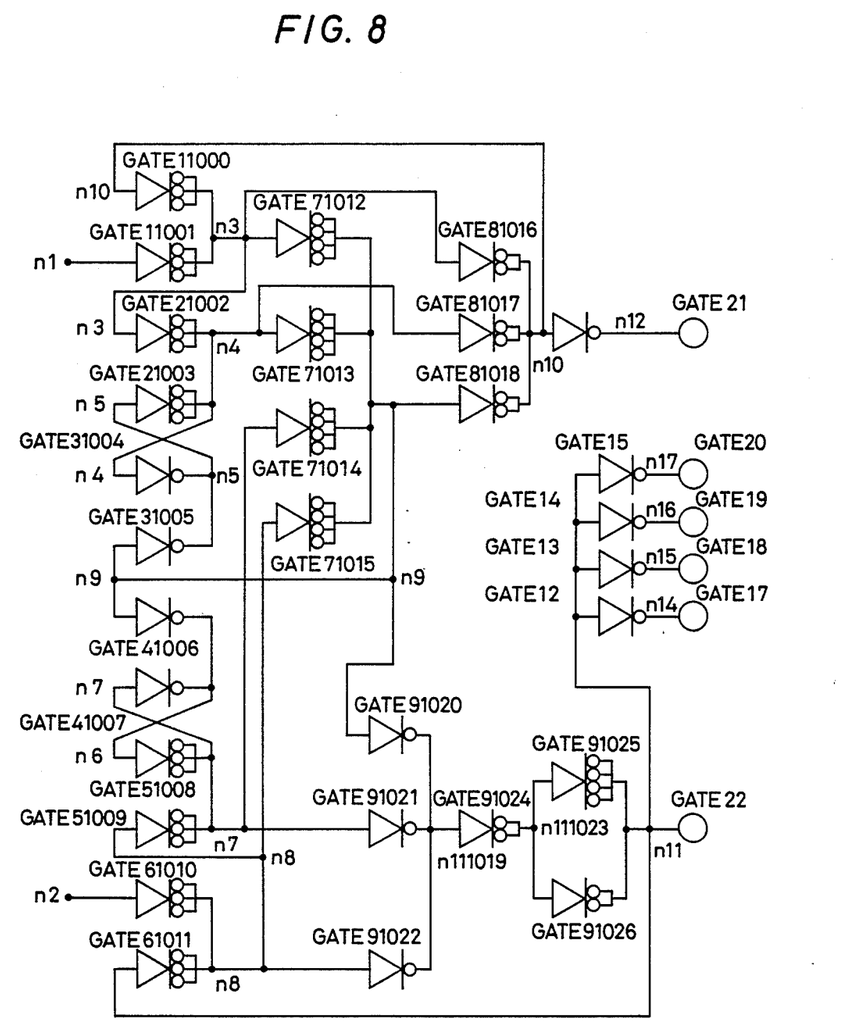
FIG. 8 is a logic diagram of a result obtained when the circuit of FIG. 7 has been translated into an i$^2$L circuit by the circuit translation method of the present invention.

FIG. 8 shows a result obtained when the circuit of FIG. 7 has been translated by the method of the present invention.

Now, the details of the contents of the present invention will be described in conjunction with concrete examples of programs Hereinbelow, logic programs will be utilized for realizing the programs. Since the details of the logic programs are contained in W. F. Clocksin, C. S. Mellish, "Programming in Prolog", Springer-Verlag 1981, etc., they shall be omitted.

(1) Circuit net data (Before translation)

Program List (1) indicates data 210 in FIG. 3, and represents data corresponding to FIG. 7 with a logic program. Data 1000 expresses that a gate 10 is an inverter of a CMOS circuit and that it receives a signal of point n10 and delivers a signal of point n12. Data 1100 expresses that a gate 1 is a NOR circuit of a CMOS circuit and that it creates a signal of point n3 from two signals of points n1 and n10. Data 1200 expresses that the gate 17 is the output terminal and that it receives a signal of a point n14. _155 in out(_155) is the dummy variable of the logic program, and expresses the nonexistence of a fixed output point.

| Program List (1) | |
|---|---|
| /* cmos gate net list */ | |
| gate(cmos,gate10,inverter,in([n10]),out([n12])). | 1000 |
| gate(cmos,gate11,inverter,in([n11]),out([n13])). | |
| gate(cmos,gate12,inverter,in([n11]),out([n14])). | |
| gate(cmos,gate13,inverter,in([n11]),out([n15])). | |
| gate(cmos,gate14,inverter,in([n11]),out([n16])). | |
| gate(cmos,gate15,inverter,in([n11]),out([n17])). | |
| gate(cmos,gate16,inverter,in([n13]),out([n18])). | |
| /* cmos gate net list */ | |
| gate(cmos,gate1,nor,in([n1,n10]),out([n3])). | 1100 |
| gate(cmos,gate2,nor,in([n3,n5]),out([n4])). | |
| gate(cmos,gate3,nor,in([n4,n9]),out([n5])). | |
| gate(cmos,gate4,nor,in([n9,n7]),out([n6])). | |
| gate(cmos,gate5,nor,in([n6,n8]),out([n7])). | |
| gate(cmos,gate6,nor,in([n2,n11]),out([n8])). | |
| gate(cmos,gate7,nor,in([n3,n4,n7,n8]),out([n9])). | |
| gate(cmos,gate8,nor,in([n3,n4,n9]),out([n10])). | |
| gate(cmos,gate9,nor,in([n9,n7,n8]),out([n11])). | |
| /* cmos gate net list */ | |
| gate(cmos,gate17,output,in([n14]),out([l15])). | 1200 |
| gate(cmos,gate18,output,in([n15]),out([l15])). | |
| gate(cmos,gate19,output,in([n16]),out([l15])). | |
| gate(cmos,gate20,output,in([n17]),out([l15])). | |
| gate(cmos,gate21,output,in([n12]),out([l15])). | |
| gate(cmos,gate22,output,in([n18]),out([l15])). | |

(2) Circuit net data (After primary translation)

Program List (2) indicates circuit net data after the primary translation 310 in FIG. 3. Data 2000 signifies that the gate 10 of the CMOS circuit supplies its output to the gate 21 and that the fanout number thereof is 1, while the fanin number thereof is 1. Data 2100 signifies that the gate 1 supplies its output to gates 8 and 7 and that the fanout number thereof is 3, while the fanin number thereof is 2. These data items are intermediate data which have been generated by a circuit translation program in order to facilitate circuit translation.

| Progam List (2) | |
|---|---|
| /* intermediate gate net list */ | |
| gate(cmos,gate10,inverter,in([n10]),out([n12])), | 2000 |
| funoutlist([gate21]),funoutno(1),funinno(1)). | |
| gate(cmos,gate11,inverter,in([n11]),out([n13])), | |
| funoutlist([gate16]),funoutno(1),funinno(1)). | |
| gate(cmos,gate12,inverter,in([n11]),out([n14])), | |
| funoutlist([gate17]),funoutno(1),funinno(1)). | |
| gate(cmos,gate13,inverter,in([n11]),out([n15])), | |
| funoutlist([gate18]),funoutno(1),funinno(1)). | |
| gate(cmos,gate14,inverter,in([n11]),out([n16])), | |
| funoutlist([gate19]),funoutno(1),funinno(1)). | |
| gate(cmos,gate15,inverter,in([n11]),out([n17])), | |
| funoutlist([gate20]),funoutno(1),funinno(1)). | |
| gate(cmos,gate16,inverter,in([n13]),out([n18])), | |
| funoutlist([gate22]),funoutno(1),funinno(1)). | |
| /* intermediate gate net list */ | |
| gate(cmos,gate1,nor,in([n1,n10]),out([n3]), | 2100 |
| funoutlist([gate8,gate7,gate2]), | |
| funoutno(3),funinno(2)). | |
| gate(cmos,gate2,nor,in([n3,n5]),out([n4]), | |
| funoutlist([gate8,gate7,gate3]), | |
| funoutno(3),funinno(2)). | |
| gate(cmos,gate3,nor,in([n4,n9]),out([n5]), | |
| funoutlist([gate2]),funoutno(1),funinno(2)). | |
| gate(cmos,gate4,nor,in([n9,n7]),out([n6]), | |

Program List (2) -continued

```
funoutlist([gate5]),funoutno(1),funinno(2)).
gate(cmos,gate5,nor,in([n6,n8]),out([n7]),
funoutlist([gate9,gate7,gate4]),
funoutno(3),funinno(2)).
gate(cmos,gate6,nor,in([n2,n11]),out([n8]),
funoutlist([gate9,gate7,gate5]),
funoutno(3),funinno(2)).
gate(cmos,gate7,nor,in([n3,n4,n7,n8]),out([n9]),
funoutlist ([gate9,gate8,gate4,gate3]),
funoutno(4),funinno(4)).
gate(cmos,gate8,nor,in([n3,n4,n9]),out([n10]),
funoutlist([gate10,gate1]),funoutno(2),funino(3)).
gate(cmos,gate9,nor,in([n9,n7,n8]),out([n11]),
funoutlist([gate15,gate14,gate13,gate12,gate11,gate6]),
funoutno(6),funinno(3).
```

(3) Circuit net data (After secondary translating)

Program List (3) represents data of i²L circuits obtained as the results of the secondary translation 320 in FIG. 3.

Data 3000 indicates that the inverter of the gate 10 exists as an i²L circuit and that it receives the signal of the point n10, while as its output, a collector 1 provides the signal of the point n12. Data 3300 expresses an inverter having three collectors. In the circuit data, two inverters which are connected in series and which are reducible coexist as indicated at 3100 and 3200.

Program List (3)

```
/* iil gate net list */
gate(iil,inverter,gate10,in([n10]),                        3000
out([col(1,n12)])).
gate(iil,inverter,gate11,in([n11]),                        3100
out([col(1,n13)])).
gate(iil,inverter,gate12,in([n11]),
out([col(1,n14)])).
gate(iil,inverter,gate13,in([n11]),
out([col(1,n15)])).
gate(iil,inverter,gate14,in([n11]),
out([col(1,n16)])).
gate(iil,inverter,gate15,in([n11]),
out([col(1,n17)])).
gate(iil,inverter,gate16,in([n13]),                        3200
out([col(1,n18)])).
gate(iil,inverter,gate11000,in([n1]),
out([col(3,n3),col(2,n3),col(1,n3)])).                     3300
gate(iil,inverter,gate11001,in([n10]),
out([col(3,n3),col(2,n3),col(1,n3)])).
gate(iil,inverter,gate21002,in([n3]),
out([col(3,n4),col(2,n4),col(1,n4)])).
gate(iil,inverter,gate21003,in([n5]),
out([col(3,n4),col(2,n4),col(1,n4)])).
gate(iil,inverter,gate31004,in([n4]),out([col(1,n5)])).
gate(iil,inverter,gate31005,in([n9]),out([col(1,n5)])).
gate(iil,inverter,gate41006,in([n9]),out([col(1,n6)])).
gate(iil,inverter,gate41007,in([n7]),out([col(1,n6)])).
gate(iil,inverter,gate51008,in([n6]),
out([col(3,n7),col(2,n7),col(1,n7)])).
gate(iil,inverter,gate51009,in([n8]),
out([col(3,n7),col(2,n7),col(1,n7)])).
gate(iil,inverter,gate61010,in([n2]),
out([col(3,n8),col(2,n8),col(1,n8)])).
gate(iil,inverter,gate61011,in([n11]),
out([col(3,n8),col(2,n8),col(1,n8)])).
gate(iil,inverter,gate71012,in([n3]),
out([col(4,n9),col(3,n9),col(2,n9),col(1,n9)])).
gate(iil,inverter,gate71013,in([n4]),
out([col(4,n9),col(3,n9),col(2,n9),col(1,n9)])).
gate(iil,inverter,gate71014,in([n7]),
out([col(4,n9),col(3,n9),col(2,n9),col(1,n9)])).
gate(iil,inverter,gate71015,in([n8]),
out([col(4,n9),col(3,n9),col(2,n9),col(1,n9)])).
gate(iil),inverter,gates1016,in([ n3]),
out([col(2,n10),col(1,n10)])).
```

Program List (3) -continued

```
gate(iil,inverter,gate81017,in([n4]),
out([col(2,n10),col(1,n10)])).
gate(iil,inverter,gate81018,in([n9]),
out([col(2,n10),col(1,n10)])).
gate(iil,inverter,gate91020,in([n9]),out([col(1,n111019)])).
gate(iil,inverter,gate91021,in([n7]),out([col(1,n111019)])).
gate(iil,inverter,gate91022,in([n8]),out([col(1,n111019)])).
gate(iil,inverter,gate91024,in([n111019]),
out([col(2,n111023),col(1,n111023)])).
gate(iil,inverter,gate91025,in([n111023]),
out([col(4,n11),col(3,n11),col(2,n11),col(1,n11)])).
gate(iil,inverter,gate91026,in([n111023]),
out([col(2,n11),col(1,n11)])).
```

(4) Circuit net data (After tertiary translation)

Program List (4) represents data of i²L circuits obtained as the results of the tertiary translation 330 in FIG. 3. In these results, the circuit elements reducible in Program List (3) have been reduced. Data 4000 indicates reduced portions, and expresses that gates 11 and 16 have been reduced to short an input point n11 and an output point n18. This program list corresponds to the circuit in FIG. 8 and also to the circuit net data in FIG. 3.

Program List (4)

```
/* iil gate net list */
gate(iil,inverter,gate10,in([n10]),out([col(1,n12)])).
gate(iil,inverter,gate12,in([n11]),out([col(1,n14)])).
gate(iil,inverter,gate13,in([n11]),out([col(1,n15)])).
gate(iil,inverter,gate14,in([n11]),out([col(1,n16)])).
gate(iil,inverter,gate15,in([n11]),out([col(1,n17)])).
gate(iil,inverter,gate11000,in([n1]),
out([col(3,n3),col(2,n3),col(1,n3)])).
gate(iil,inverter,gate11001,in([n10]),
out([col(3,n3),col(2,n3),col(1,n3)])).
gate(iil,inverter,gate21002,in([n3]),
out([col(3,n4),col(2,n4),col(1,n4)])).
gate(iil,inverter,gate21003,in([n5]),
out([col(3,n4),col(2,n4),col(1,n4)])).
gate(iil,inverter,gate21003,in([n5])),
out([col(3,n4),col(2,n4),col(1,n4)])).
gate(iil,inverter,gate31004,in([n4]),out([col(1,n5)])).
gate(iil,inverter,gate31005,in([n9]),out([col(1,n5)])).
gate(iil,inverter,gate41006,in([n9]),out([col(1,n6)])).
gate(iil,inverter,gate41007,in([n7]),out([col(1,n6)])).
gate(iil,inverter,gate51008,in([n6]),
out([col(3,n7),col(2,n7),col(1,n7)])).
gate(iil,inverter,gate51009,in([n5]),
out([col(3,n7),col(2,n7),col(1,n7)])).
gate(iil,inverter,gate61010,in([n2]),
out([col(3,n8),col(2,n8),col(1,n8)])).
gate(iil,inverter,gate61011,in([n11]),
out([col(3,n8),col(2,n8),col(1,n8)])).
gate(iil,inverter,gate71012,in([n3]),
out([col(4,n9),col(3,n9),col(2,n9),col(1,n9)])).
gate(iil,inverter,gate71013,in([n4]),
out([col(4,n9),col(3,n9),col(2,n9),col(1,n9)])).
gate(iil,inverter,gate71014,in([n7]),
out([col(4,n9),col(3,n9),col(2,n9),col(1,n9)])).
gate(iil,inverter,gate71015,in([n8]),
out([col(4,n9),col(3,n9),col(2,n9),col(1,n9)])).
gate(iil,inverter,gate81016,in([n3]),
out([col(2,n10),col(1,n10)])).
gate(iil,inverter,gate81017,in([n4]),
out([col(2,n10),col(1,n10)])).
gate(iil,inverter,gate81018,in([n9]),
out([col(2,n10),col(1,n10)])).
gate(iil,inverter,gate91020,in([n9]),out([col(1,n111019)])).
gate(iil,inverter,gate91021,in([n7]),out([col(1,n111019)])).
gate(iil,inverter,gate91022,in([n8]),out([col(1,n111019)])).
gate(iil,inverter,gate91024,in([n111019]),
out([col(2,n111023),col(1,n111023)])).
gate(iil,inverter,gate91025,in([n111023]),
```

Program List (4) -continued

```
out([col(4,n11),col(3,n11),col(2,n11),col(1,n11)])).
gate(iil,inverter,gate91026,in([n111023]),
out([col(2,n11),col(1,n11)])).
/* iil gate net list */
gate(iil,line,reduced(gate11,gate16),                4000
in([n11]),out([n18])).
```

(4') Circuit translation program

Program List (5) indicates the program 240 in FIG. 3. Numeral 5000 designates an instruction program for executing this program, and numeral 5010 the processing instruction 300 in FIG. 3. Circuit net data is input from a file ... 210 ... whose identifier is cmosfl. Data 5020 gives the instruction of executing the processes 310 et seq. in FIG. 3 and writing down the results in a file ansfile 220 ... Programs for executing the portion 5020 concretely are indicated at 5100 et seq. The program 5200 corresponds to the step 310 in FIG. 3, and primarily translates inverter elements and nor elements within the CMOS circuit. The program 5300 executes the secondary translation corresponding to the step 320 in the figure, and the program 5400 outputs original circuit data and intermediate circuit data after the primary translation (for the sake of reference) (for the sake of convenience, the file 220 is utilized as an output destination). The program 5500 executes the reduction of the reducible circuit elements, and the program 5600 executes the output of the final results to the file 220. The processes of the respective stages are performed using the circuit translation knowledge groups (actually, programs written with logical instructions) indicated at numeral 230 in FIG. 3. The contents thereof will be indicated below.

Program List (5)

```
/* circuit translation command */
?- consult (cmosfl), translate_cmos_to_iil(ansfile).   5000
         └──>5010        └──>5020

/* main program */
translate_cmos_to_iil(FILE):-                          5100 translate_1(inverter),    ⎫
    translate_1(nor),         ⎬                        5200 translate_2(inverter),    ⎫
    translate_2(nor),         ⎬                        5300
    tell(FILE),               ⎭ output(inverter,cmos),    ⎫
    output(nor    ,cmos),     ⎪
    output(output ,cmos)      ⎪
    output(inverter,intermid),⎬                        5400
    output(nor    ,intermid), ⎪
    output(output ,intermid), ⎪
    output(inverter,iil),     ⎭ reduce_iil_inverter,                               5500 output(inverter,iil),     ⎫
    output(line    ,iil),     ⎬                        5600
    told.                     ⎭
```

(5) Circuit translation knowledge groups

(5)-a Primary translation knowledge group

Program List (6) is the knowledge group for the primary translation. A program 6000 translates 'inventer (gate 10–gate 16)' in Program List (1) into the intermediate data of the program 2000 etc. in Program List (2). The fanout number and the fanin number are examined for each of inverter elements in the CMOS circuit element representation by a portion 6100, t and intermediate data is generated by a portion 6200. A variable W expresses the intermediate data. assert (W) is the instruction of storing the intermediate data W generated.

Numeral 6500 indicates translation knowledge for NOR elements.

Program List (6)

```
/* translaion rules : cmos_to_intermid */
/* translate inverter */
translate_1(inverter):-                              6000
gate(cmos,Gate,inverter,in(IL),           ⎫
out([Funout])),                           ⎪
examine_funout(cmos,Gate,Funout,          ⎬ 6100
Funoutlist),                              ⎪
length(Funoutlist,Funoutno),              ⎪
length(IL, Funoutno),                     ⎭
W = .. [gate,cmos,Gate,inverter,in(IL),   ⎫
out([Funout]),funoutlist(Funoutlist),     ⎬ 6200
funoutno(Funoutno),funinno(Funinno)],     ⎭
assert(W),fail.
translate_1(inverter).
/* translate nor */
translate_1(nor):-                                   6500
gate(cmos,Gate,nor,in(IL),Funout,Funoutlist),
length(Funoutlist,Funoutno),
length(IL, Funinno),
W = .. [gate,cmos,Gate,nor,in(IL),out([Funout]),
funoutlist(Funoutlist),funoutno(Funoutno),
funinno(Funinno)],
assert(W),fail.
translate_1(nor).
```

(5)-b Secondary translation knowledge group

Program List (7) expresses the knowledge group for the secondary translation. Portions 7000 et seq. are rules for translating the inverter circuits in the CMOS circuit into inverters in i²L circuits. Portions 7200 et seq. are translation rules concerning NOR elements.

In a portion 7300, properties are examined as to each of the NOR elements in the CMOS circuits represented in the forms indicated in Program List (2), and among the rules explained in FIG. 5 for the translation into the i²L circuits, the fanout number FN is compared with the upper limit value Max (Max=4 in the explanation of FIG. 5). A portion 7400 corresponds to the generation of i²L circuit element representation for FN not greater than Max, and a portion 7500 the generation of i²L circuit element representation for FN greater than Max. A portion is a program sentence for instructing the repetition of the above processes.

Program List (7)

```
/* translation rules : intermid_to_iil */
/* translate inverter */
translate_2(inverter):-                              7000
gate(cmos,Gate,inverter,in([IN]),out([OUT]),
funoutlist(FL),funoutno(FN),funinno(FI)),
funoutlimit(Max),
```

| Program List (7) | |
|---|---|
| (FN = <Max, | |
| generate_iil_inverter(Gate,IN,OUT,FN); | |
| FN >Max,FN <Max*Max, | |
| gensim(IN,OUT1), | |
| generate_iil_inverter(Gate,IN,OUT1,1), | |
| gensim(IN,OUT2), | |
| gensim(Gate,NEWNAME), | |
| int_inv_collectno(FN,Max,COLLECTERND), | |
| generate_iil_inverter(NEWNAME,OUT1,OUT2,COL- | |
| LECTERNO), | |
| generate_iil_inverter_ladder(Gate,OUT2,OUT2,OUT | |
| FN)), | |
| fail. | |
| translate_2(inverter) | |
| /* translate nor */ | |
| translate_2(nor):- | 7200 |
| gate(cmos,Gate,nor,in([IN]),out([OUT]), | |
| funoutist(FL),funoutno(FN), | |
| funinno(FI)), | 7300 |
| funout,limit(Max), | |
| (FN =<Max, | |
| generate_iil_fork(Gate,IL,OUT,FN); | 7400 |
| gensim(OUT,OUT1), | |
| generate_iil_fork(Gate,IL,OUT1,1), | |
| int_inv_collectno(FN,Max,ANS1), | |
| gensim(OUT,OUT2), | 7500 |
| gensim(Gate,Gate1), | |
| generate_iil_inverter(Gate,OUT1,OUT2,ANS1), | |
| generate_iil_inverter_ladder(Gate,OUT2, | |
| OUT FN)), | |
| fail. | 7600 |
| translate_2(nor). | |

(5)-c Tertiary translation knowledge group Program List (8) is the tertiary translation knowledge indicated at the step 330 in FIG. 3. A portion 8000 translates Program List (3) into Program List (4). A portion 8100 examines two reducible elements. A portion reduces them and replaces them with a simple connection. A portion 8300 serves to judge the reducibility, and expresses the rules explained in FIG. 6. A portion is a program which examines the presence of a connective relation for use in the portion 8300.

| Program List (8) | |
|---|---|
| /* iil circuit inverter reduction */ | |
| reduce_iil_inverter: | 8000 |
| reducible(GATE1,GATE2), | 8100 |
| retract(gate(iil,inverter,GATE1,in([X]), | |
| out([col(_,Y)]))), | |
| retract(gate(iil,inverter,GATE2,in([Y]), | |
| out([col(_,Z)]))), | 8200 |
| assert(gate(iil,line, reduced(GATE1, | |
| GATE2),in([X]),out([Z]))), | |

| Program List (8) | |
|---|---|
| fail. | |
| reduce_iil_inverter. | |
| reducible(GATE1,GATE2): | 8300 |
| gate(iil,inverter,GATE1,in([X]),out([col(_,Y)])), | |
| gate(iil,inverter,GATE2,in([Y]),out([col(_,Z)])), | |
| gate(iil,inverter,GATE3,in([V]),out(LIST)), | |
| not(wired(Z,LIST)), | |
| not(wired(Y,LIST)), | |
| not(in(Y,V)). | |
| /* rules for iil inverter reducibility judgment */ | |
| wired(Z,LIST): | 8400 |
| compress(LIST,LIST1), | |
| member(Z,LIST1). | |

(5)-d Other knowledge groups

Program List (9) indicates subprograms for use in the various programs stated above. A portion 9000 generates the fork-shaped connection of inverters (refer to FIG. 5) which is required when translating the NOR circuit of the CMOS circuit into i$^2$L. A portion 9020 generates the ladder shape of the same (the inverters 440 et seq. in FIG. 4 present the ladder shape of four stages). A portion 9030 generates one inverter in the i$^2$L circuit. A portion 9040 generates the structure of the collector portion in the i$^2$L circuit (a function coping with the fact that the number of collectors varies depending upon the fanout number).

A portion 9050 analyzes the fanout number of each element which is utilized when preparing Program List (2) from the circuit element representation of Program List (1). A portion 9060 examines the number of collectors of the inverter (four in the example 420 in FIG. 4) which is inserted immediately before the ladder-shaped stages of the inverters in the i$^2$L circuit. A portion 9070 defines a numerical value 4 (the upper limit value of the number of the permissible collectors of the i$^2$L inverter) which affords the condition of changing the translation rules in FIG. 4 or FIG. 5.

A portion 9080 examines whether or not a certain element is included in a certain list. A portion 9090 generates new identifiers successively, and they are utilized for the generation of gate Nos. on the i$^2$L side. A portion 9100 appends two lists. A portion 9110 finds the minimum value between two numbers. A Portion 9120 negates X. A portion 9130 examines whether or not Y and V are equal. A portion 9140 generates a list [Y1, Y2 . . . ] from a list [col(X1, Y1), col(X2, Y2), . . . ].

A portion 9150 outputs the data of the CMOS circuit to the file 220. A portion 9160 outputs intermediate circuit data. A portion 9170 outputs the i$^2$L circuit.

| Program List (9)-1 | |
|---|---|
| /* generate fork structure for intermid_to_iil */ | |
| generate_iil_fork(_,[],_,_):-!. | |
| generate_iil_fork(Gate,[INDIT],OUTNODE, | |
| FUNOUTNO):- | |
| gensim(Gate,Ans), | |
| generate_iil_inverter(Ans,IND,OUTNODE, | |
| FUNOUTNO), | 9000 |
| generate_iil_fork(Gate,T,OUTNODE, | |
| FUNOUTNO). | |
| /* generate ladder structure for intermid_to_iil */ | |
| generate_iil_inverter_ladder(Gate,IN,OUT, | |
| FUNOUTND):- | |
| FUNOUTNO>0, | |
| funoutlimit(MAX), | |

```
gensim(Gate,ANs),
min(MAX, FUNOUTNO.MIN),
generate_iil_inverter(ANS,IN,OUT,MIN),
FUNOUT1 is FUNOUTN0-MAX,
generate_iil_inverter_ladder(Gate,IN,
OUT,FUNOUT1).
generate_iil_ladder(_,_,_,0).
/* generation rule for iil inverter */
generate_iil_inverter(Gate,IN,OUT,FN):-
generate_col[_list(OUT,FN,Anslist),
W = . . . [gate,iil,inverter,Gate,in([IN]),
out(Anslist)],
assert(W),!.
generate_col_list(_,0,[]).
generate_col_list(OUT,FN,[col(FN,OUT)IT]):-
FNN is FN-1,generate_col_list(OUT,FNN,T).
```
9020
9030
9040

Program List (9)-2

```
/* funout examination for cmos */
examine_funout(cmos,Gate,Funout,Funoutlist):-
bagof(X,Z IL Funout connected(cmos,X,Z,
in(IL),out(_),Funout),Funoutlist),!.
int_inv_collectno(FUNOUT,MAX,ANS):-
FUNOUT>MAX,
ANS is (FUNOUT-1)/MAX +1.
/* maximum collector number of iil inverter */
funoutlimit(4).
```
9050
9060
9070

Program List (9)-3

```
/* utility programs */
member(X,Y[XI_]).
member(X,[_IY:):-member(X,Y).
gensim(Functer,Answer):-
retract(seed(N)),
name(Functer,Flist),name(N,Nlist),
append(Flist,Nlist,Anslist),
name(Answer Anslist),
NN is N+1,
assert(seed(NN)),!.
seed(1000).
appent([],L,L).
append([XIL],Y,[XIZ]):-append(L,Y,Z).
min(A,B,A):-A=<B,!.
min(A,B,B).
not(X):-X,!,fail
not(_).
in(Y,V):-
Y==V.
compress([],[]):-!.
compress([col(X,Y)IT],[YIT1]):-
compress(T,T1).
```
9080
9090
9100
9110
9120
9130
9140

Program List (9)-4

```
/* output translation result */
output(GATE,cmos):-
nl,nl,nl,nl,
write('/* cmos gate net list */'),nl,nl,
(gate(cmos,GNAME,GATE,X,Y),
write(gate(cmos,GNAME,GATE,X,Y)),
write('.'),nl,fail;true).
output(GATE,intermid):-
nl,nl,nl,nl,
write('/* intermediate gate net list */'),
nl,nl
(gate(cmos,GNAME,GATE,X,Y,U,W),
write(gate(cmos,GNAME,GATE,X,Y,U,V,W)),
write('.'),nl,fail;true).
output(GATE,iil):-
nl,nl,nl,nl,
write('/* iil gate net list */'),nl,nl,
(gate(iil,GATE,GATENAME,X,Y),
write(gate(iil,GATE,GATENAME,X,Y)),
write('.'),nl,fail;true).
```
9150
9160
9170

According to the present invention, the automatic translation of circuit diagrams required when a circuit having the same function is to be realized by a different device can be readily realized. As a concrete example of application, it is possible to realize the automatic translation of a CMOS circuit into an $i^2L$ circuit as will be required for the development of an application specific analog/digital compound VLSI circuit in the future. Since circuit element translation rules vary depending upon the connective relations of a specified element with other circuit elements, and so on, circuits have hitherto been deemed difficult for automatic translation and were translated by man power only. Therefore, the translation of a CMOS circuit of about 1000 elements, for example, requires a period of approximately 20 man-months, and must be rechecked many times to correct errors. Owing to the present invention, the automation of the operation becomes possible, and the errors can be prevented. Thus, the invention can greatly contribute to shortening the period of time for the design and development of the application specific analog/digital compount circuit.

What is claimed is:

1. An automatic circuit translation method for translating first circuit net data representing a first circuit into second circuit net data representing a second circuit realizing the same function as that of a first circuit represented by said first circuit net data in a system having a processor means for processing data and a memory means for storing translation rules of circuit element representations each of which is determined depending upon connective relations of each circuit element with at least one circuit element and upon the function of each circuit element, wherein each of said translation rules is described by a predicate logic program, and wherein each of said first and second circuit net data is described by a predicate logic program, said method comprising the steps of:

inputting said first circuit net data to said processor means;

extracting, by said processor means, the connective relations between circuit elements in the first circuit from the inputted first circuit net data;

selecting a translation rule on the basis of the extracted connective relations;

translating, by said processor means, the circuit elements of the first circuit represented by said inputted first circuit net data to those of the second circuit represented by the second circuit net data based on a selected translation rule; and outputting said second circuit net data as results of the translation from said processor means.

2. An automatic circuit translation method according to claim 1, wherein rules for simplifying predetermined circuits are stored in said memory means to simplify the second circuit represented by said second circuit net data.

3. An automatic circuit translation method according to claim 1, wherein said connective relations include fan-in numbers and fan-out numbers of said circuit elements.

4. An automatic circuit translation method according to claim 1, wherein said connective relations with said other circuit elements are determined based on at least a possible fan-out number of each circuit element.

5. An automatic circuit translation method according to claim 1, wherein said translation rules include rules for representations of NOR circuit elements in a CMOS circuit.

6. An automatic circuit translation method according to claim 1, wherein said translation rules include rules which have been determined by connections similar to those of said second circuit.

7. An automatic circuit translation method according to claim 1, wherein said translation rules include rules which have been determined by connections similar to those of said second circuit.

8. An automatic circuit translation method for translation first circuit net data representing a first circuit into second circuit net data representing a second circuit realizing the same function as that of the first circuit represented by said first circuit net data in a system having a processor means for processing data and a memory means for storing translation rules of circuit element representations each of which is determined depending upon connective relations of each circuit element with at least one circuit element and upon the function of each circuit element and upon the function of each circuit element, wherein each of said translation rules is described by a predicate logic program and wherein each of said first and second circuit net data is described by a predicate logic program, said method comprising the steps of:

inputting said first circuit net data to said processor means;

translating, by said processing means, said first circuit net data into said second circuit net data based on said translation rules from said memory means; and outputting said second circuit net data as a result of the translation by said processor means.

9. An automatic circuit translation method according to claim 1 or 8, wherein said first circuit comprises a logical gate and said second circuit comprises an I$^2$L gate.

10. An automatic circuit translation method according to claim 1 or 8, which further comprises a step of extracting connective relations between the circuit elements.

11. An automatic circuit translation method according to claim 1 or 8, which further comprises a step of reducing at least one circuit element from said second circuit net data as the result of the translation.

12. An automatic circuit translation method according to claim 10, wherein said extracted data includes fanout number and fanin number of the circuit element.

13. An automatic circuit translation method according to claim 1 or 8, wherein said translation rules include a rule for examining the connective relation between the circuit element of said first circuit and a rule for translating said first circuit net data into said second circuit net data in response to the result of the examination.

14. An automatic circuit translation method according to claim 13, wherein said examining step comprises a step of comparing a fanout number of the circuit element with a predetermined value.

15. An automatic circuit translation method for translating first circuit net data representing a first circuit into second circuit net data representing a second circuit realizing the same function as that of the first circuit represented by said first circuit net data in a system having a processor means for processing data and a memory means for storing translation rules of circuit element representations each of which is determined depending upon connective relations of each circuit element with at least one circuit element and upon the function of each circuit element, wherein each of said translation rules is described by a predicate logic program, and wherein each of said first and second circuit net data is described by a predicate logic program, said method comprising the steps of:

inputting said first circuit net data to said processor means, translating, by said processor means, a circuit element of the first circuit represented by said inputted first circuit net data to those of the second circuit represented by the second circuit net data based on a translation rule;

reducing a part of the circuit element of the second circuit obtained by said translation based on said translation rules stored in said memory means; and outputting said second circuit net data obtained by said translating and reducing steps.

16. An automatic circuit translation method according to claim 15, wherein said translating step includes the steps of:

extracting the connective relations between circuit elements in the first circuit from inputted first circuit net data;

selecting a translation rule based on the extracted connective relations; and translating the circuit elements of the first circuit to those of the second circuit based on a selected translation rule.

17. An automatic circuit translation method according to claim 1, 15 or 16, wherein said circuit elements of said first circuit and second circuit include a logical gate and a semiconductor gate respectively.

* * * * *